(12) United States Patent
Knierim et al.

(10) Patent No.: US 12,235,291 B2
(45) Date of Patent: Feb. 25, 2025

(54) CURRENT SHUNT PROBE

(71) Applicant: Tektronix, Inc., Beaverton, OR (US)

(72) Inventors: Daniel G. Knierim, Beaverton, OR (US); Josiah A. Bartlett, Forest Grove, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/227,215

(22) Filed: Apr. 9, 2021

(65) Prior Publication Data

US 2021/0318361 A1    Oct. 14, 2021

Related U.S. Application Data

(60) Provisional application No. 63/008,720, filed on Apr. 11, 2020.

(51) Int. Cl.
  *G01R 19/00*   (2006.01)
  *G01R 31/30*   (2006.01)
  *G01R 31/319*  (2006.01)

(52) U.S. Cl.
  CPC ..... *G01R 19/0092* (2013.01); *G01R 31/3004* (2013.01); *G01R 31/31924* (2013.01)

(58) Field of Classification Search
  CPC ............ G01R 19/0092; G01R 31/3004; G01R 15/146
  See application file for complete search history.

(56) References Cited

U.S. PATENT DOCUMENTS

| | | | | |
|---|---|---|---|---|
| 10,903,792 | B1 * | 1/2021 | Blom | H03L 7/085 |
| 2004/0140819 | A1 * | 7/2004 | McTigue | G01R 1/06766 |
| | | | | 324/720 |
| 2010/0045263 | A1 * | 2/2010 | Cadoux | G01R 15/146 |
| | | | | 324/127 |
| 2011/0074391 | A1 * | 3/2011 | Bartlett | G01R 1/06766 |
| | | | | 324/76.44 |
| 2017/0168094 | A1 * | 6/2017 | Chikamatsu | G01R 15/18 |
| 2018/0372655 | A1 * | 12/2018 | Dandy | G01N 22/00 |
| 2021/0058047 | A1 * | 2/2021 | Wodlinger | A61B 5/305 |
| 2021/0063440 | A1 * | 3/2021 | Swaim | G01R 19/25 |

* cited by examiner

*Primary Examiner* — Dominic E Hawkins
(74) *Attorney, Agent, or Firm* — Miller Nash LLP; Andrew J. Harrington

(57) ABSTRACT

An isolated differential current shunt measurement probe for a test and measurement system having an isolation barrier between an input side and output side of the probe. The input side is configured to receive a voltage signal across a current shunt connected to a device under test and transmit the voltage signal across the isolation barrier. The output side is configured to receive the voltage signal across the isolation barrier and output the voltage signal to a test and measurement instrument.

20 Claims, 4 Drawing Sheets

CURRENT SHUNT PROBE

PRIORITY

This disclosure claims benefit of U.S. Provisional Application No. 63/008,720, titled "CURRENT SHUNT PROBE," filed on Apr. 11, 2020, which is incorporated herein by reference in its entirety.

TECHNICAL FIELD

This disclosure is directed to systems and methods related to test and measurement systems, and in particular, to a test and measurement instrument probe for measuring a current in a device under test (DUT).

BACKGROUND

The ability to measure electrical current is important when developing and testing switching power supplies, motor drives, battery chargers, wireless chargers, photovoltaic inverters, and other related power electronics. One common approach to measuring current involves placing a low-value resistor, often referred to as a "current shunt," in series with a path of the current to be measured. The resultant voltage drop across the current shunt can be measured to determine the electrical current based on the known resistance of the current shunt. However, there are at least two substantial hurdles when this approach is used to measure dynamic currents.

First, the voltage drop across the current shunt is purposely kept small to minimize an impact on the DUT, but this small voltage must often be measured in the presence of a much higher common-mode voltage. For instance, the current shunt voltage may be in the millivolts or tens of millivolts range, whereas the common-mode voltage may be hundreds of volts. Measuring such a relatively small current shunt voltage typically requires using a differential measurement device (such as, for example, an oscilloscope probe) with extremely high common-mode range and common-mode rejection ratio (CMRR).

Second, the current shunt will exhibit inductance as well as resistance, R, so the voltage, V, developed across the current shunt from a current, i, is $V = i \cdot R + L \cdot di/dt$. The effective inductance of the current shunt, L, varies with the physical shape, size, and placement of the current shunt in the circuit and the placement of the interconnect from the current shunt to the measurement device. For a fixed layout with a permanently-attached measurement circuit, such as a permanently connected measurement probe, the fixed inductive effect may be compensated with analog hardware or digital signal processing (DSP) implementing a "pole" in the frequency response of the measurement system at the same frequency as the L/R "zero" of the shunt. But, for general probing of a circuit during the design phase, such compensation techniques may not be practical.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which.

DESCRIPTION

Figure 1:
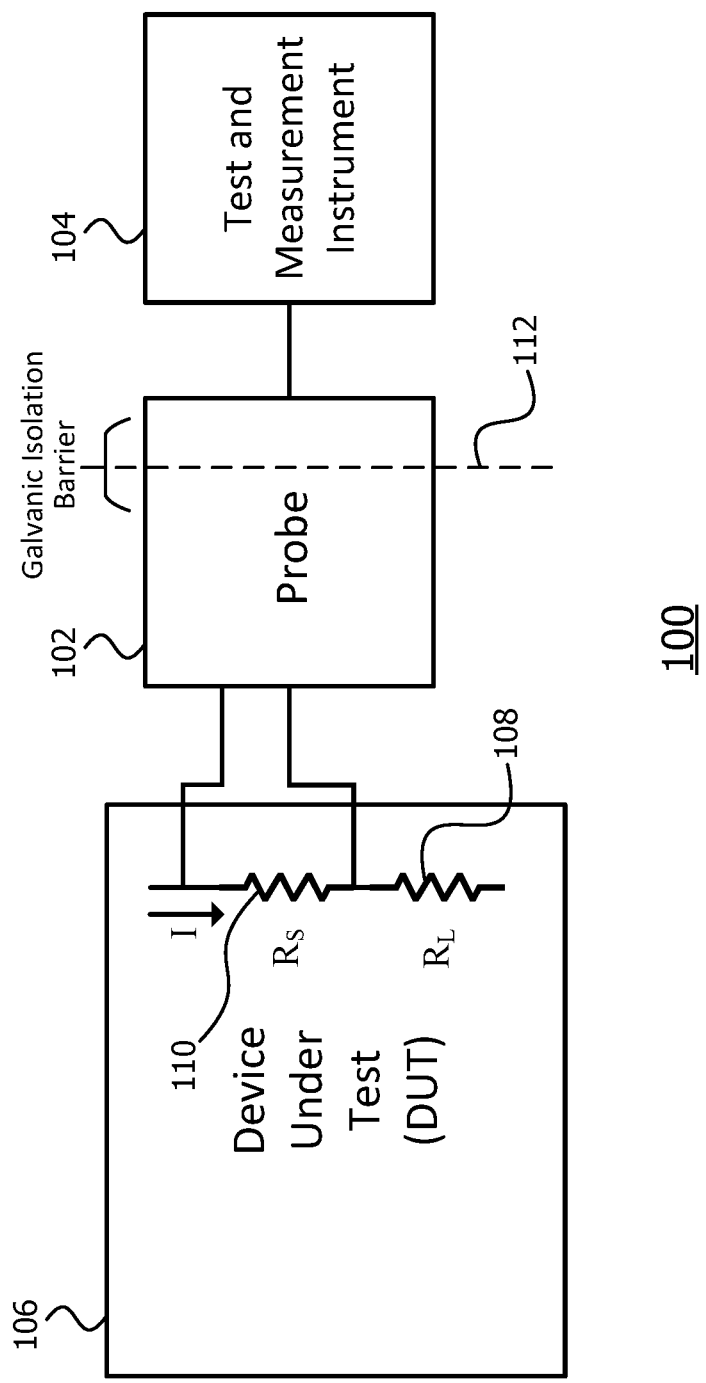
FIG. 1 is a block diagram of a test and measurement system according to some examples of the disclosure.

Disclosed herein is an isolated current-shunt measurement probe to measure dynamic current of a DUT. FIG. 1 is an example block diagram of a test and measurement system according to some examples of the disclosure. In the test and measurement system, an isolated current-shunt measurement probe 102 connects a test and measurement instrument 104 to a DUT 106.

To measure a current, I, flowing through a load $R_L$ 108 in the DUT 106, a precision current shunt resistor 110, $R_S$, is placed in series with the load 108. To minimize the voltage divider effect and resultant performance impact on the DUT, generally the current shunt resistor 110 is much smaller than the load 108 to minimize the voltage drop across the current shunt 110. Two input leads of the probe 102 are coupled across the current shunt 110 to measure the resulting voltage drop.

The probe 102 may have either a differential or single-ended output. The test and measurement instrument 104 receives the measured voltage and determines the resulting current flowing. As seen in FIG. 1, the probe 102 includes an isolation barrier 112 to maintain isolation between the DUT 106 and the test and measurement instrument 104. The isolation barrier 112 may be any structure that maintains isolation between an input side of the probe 102 and the output side of the probe 102. In some examples, the isolation barrier may be a galvanic isolation barrier that maintains galvanic isolation between the test and measurement instrument 104 and the DUT 106. That is, galvanic isolation prevents current flow between the test and measurement instrument 104 and the DUT 106. This can allow the isolation barrier 112 in the probe 102 to achieve a high common-mode range and a high CMRR.

Figure 2:
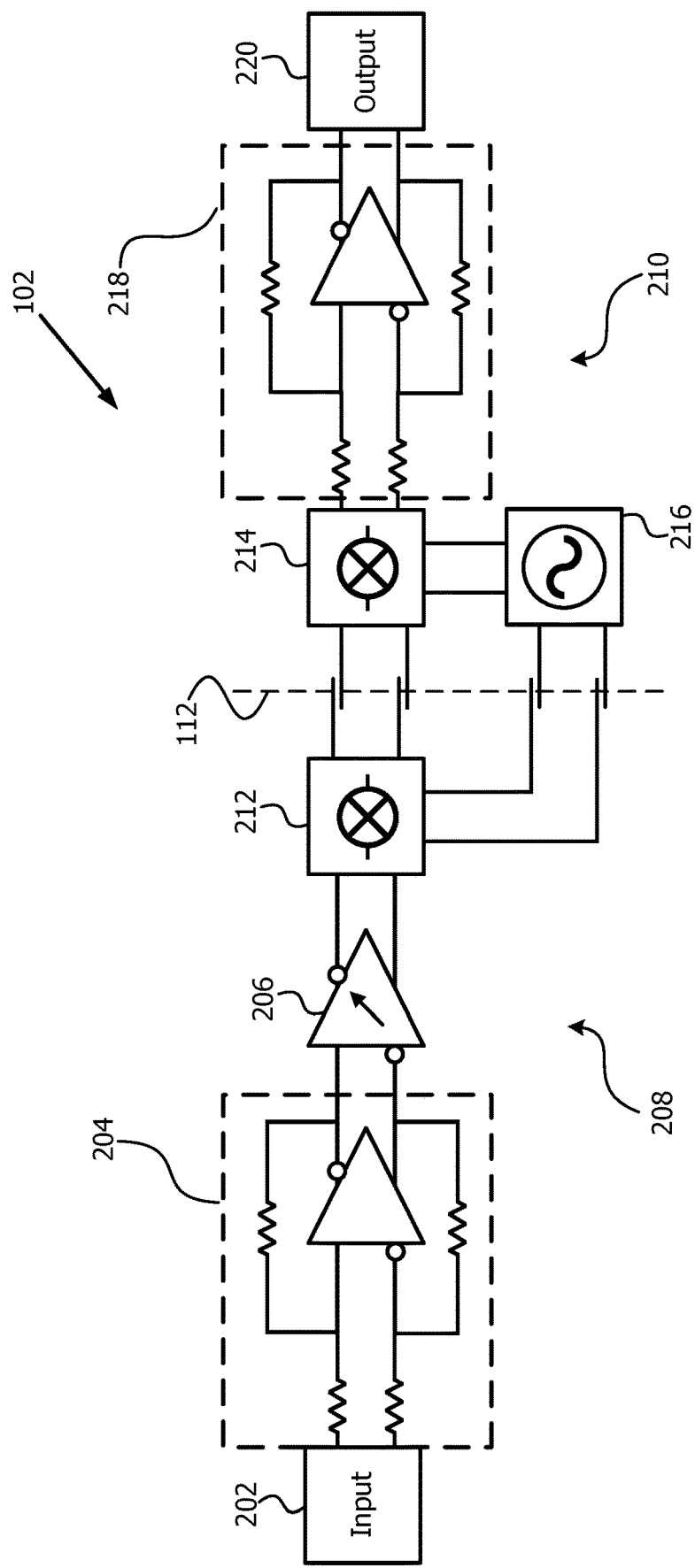
FIG. 2 is an example schematic block diagram of the probe of FIG. 1 according to some examples of the disclosure.

FIG. 2 is an example circuit of a probe 102 according to some examples of the disclosure. The probe 102 includes an input 202 coupled directly to a low-noise amplifier 204. Because the isolation barrier 112 prevents any common-mode current flow through probe 102 despite the potentially high common-mode input voltage, the low-noise amplifier 204 can have a low input impedance, such as approximately 50 ohms. For example, a suitable low noise amplifier may be a Texas Instruments LMH5401 amplifier. However, examples of the disclosure are not limited to this low noise amplifier, but may be any amplifier which has a suitably low effective input noise resistance. The Johnson voltage noise of a physical resistor is $\sqrt{4kTRB}$, where k is Boltzmann's constant, T is the absolute temperature, R is the resistance, and B is the noise measurement bandwidth. The effective noise resistance of an amplifier includes any physical resistance in series with the input, along with any other noise sources in the amplifier referred to as effective input resistance that would produce the same amount of noise. The low input impedance of the probe 102 can provide lower thermal, or Johnson, noise density than a typical test and measurement instrument probe input impedance, which allows for low-noise measurements of the small voltage drop across a current shunt. An example probe 102 according to embodiments of the disclosure may achieve an input-referred noise density of around 2-3 nV/sqrt (Hz), compared with conventional probes which exhibit noise densities greater than 10 nV/sqrt (Hz).

In contrast, conventional differential probes have much higher input impedance to avoid loading of the DUT 106 in the presence of high common-mode voltages. In examples of the disclosure, low (differential) input impedance is acceptable when measuring a voltage drop across a current shunt resistor that is generally measured in milliohms. Further, due to the galvanic isolation barrier 112, the common-mode input impedance is still very large.

The differential output of the low-noise amplifier 204 may be transmitted to a differential variable gain amplifier 206. An example of a suitable differential variable gain amplifier is a Texas Instruments LMH6401 amplifier. Examples of the disclosure, however, are not limited to this specific differential variable gain amplifier. The gain of the variable gain amplifier may be controlled by the user through a user interface (UI) of test and measurement instrument 104 or probe 102 according to the expected voltage drop across current shunt 110.

The differential output of the differential variable gain amplifier 206 can be transmitted across the galvanic isolation barrier 112 between the input side 208 of the probe 102 and the output side 210 of the probe 102. The input side 208 of the probe 102 includes an upconverter 212 configured to upconvert the input signal from a baseband frequency into a microwave frequency band. A microwave structure is provided to transmit the microwave frequency signal across the isolation barrier 112. A microwave structure electromagnetically couples the microwave frequency analog signal across the isolation barrier, but does not couple signals outside of the desired microwave frequency band (e.g. sub-microwave signals) across the isolation barrier.

The output side 210 of the probe 102 includes a microwave structure to receive the microwave frequency signal and a down converter 214 to down convert the microwave frequency signal back down to the base band frequency. The upconverter 212 and the down converter 214 may share a common clock and/or oscillator 216. The common oscillator or clock signal may be transmitted across the isolation barrier 112 via an appropriate microwave structure.

Once the signal is received at the down converter 214 across the isolation barrier 112 and has been down converted to a baseband frequency signal, the signal may be transmitted to a low-noise amplifier 218, depending on the implementation. In some examples of the disclosure, a low-noise amplifier 218 is not required. The signal is then output 220 to the test and measurement instrument 104. In some examples, the output 220 of the probe 102 may include an optional balun, producing a single-ended output signal to be input to the test and measurement instrument 104 rather than a differential output signal. The test and measurement instrument 104 receives the measured voltage signal and then can determine the current flowing through the DUT 106 based on the known current shunt resistance and the measured voltage.

Figure 3:
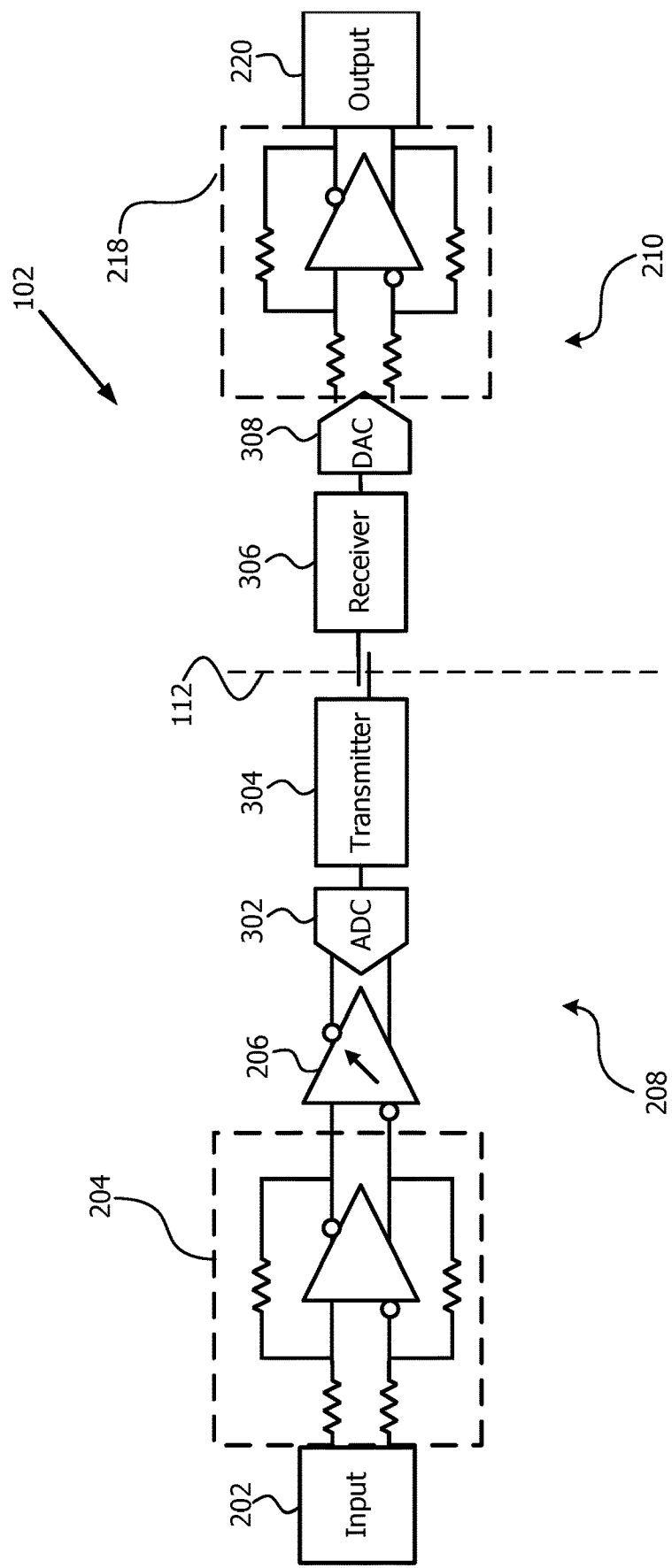
FIG. 3 is another example schematic block diagram of the probe of FIG. 1 according to other examples of the disclosure.

Examples of the disclosure, however, are not limited to transmitting an analog signal across an isolation barrier, such as the microwave isolation barrier illustrated in FIG. 2. Rather, in some examples, an analog-to-digital converter 302 may be provided on the input side 208, as illustrated in FIG. 3. FIG. 3 illustrates another example of a probe 102 and like components to those discussed in FIG. 2 are given the same reference numbers and not discussed further herein.

The voltage signal may be digitized through an analog-to-digital converter 302 prior to being transmitted by a transmitter 304 in the example of FIG. 3. The transmitter 304 may be a microwave structure, as discussed above. However, the transmitter 304 may also be a light, such as when the isolation barrier is an optical isolation barrier and the receiver 306 may be a photodiode to receive the information.

The output side 210 can include the receiver 306, as mentioned above, as well as a digital-to-analog converter 308 to convert the digital voltage signal back to an analog signal. However, in some examples, the digital signal may be sent directly to the test and measurement instrument 104, as will be understood by one skilled in the art, rather than being converted back to an analog signal prior to being transmitted through the output 220.

The transmitter 304 and the receiver 306 may also be any other type of wireless transmitter and receivers, such as, but not limited to, radio frequency or wireless fidelity (WiFi). That is, any type of isolation barrier 112 and transmitter 304 and receiver 306 may be used so long as the input side 208 and the output side 210 are isolated from each other in the probe 102.

Additionally or alternatively, some examples of the disclosure can minimize the inductance of the current shunt 110. The input 202 of the probe 102 can be designed to interface with the current shunt 110 placed in or connected to the DUT 106 to minimize or cancel a dynamic magnetic field encircled by the measurement loop. In other words, although the current shunt 110 still exhibits some inductance due to the magnetic field generated by, and encircling, the current flow in the shunt itself, placement of the leads at the input 202 of the probe 102 will avoid or cancel that same magnetic field. That is, particular design of the measurement sense loop will cause the measured voltage across the current shunt to be:

$$v = iR + Ldi/dt - Mdi/dt \tag{1}$$

where L is the self-inductance of the current shunt 110, M is the mutual inductance of the sense loop with the current shunt 110, and the sense loop size and placement is arranged so that M=L.

Figure 4:
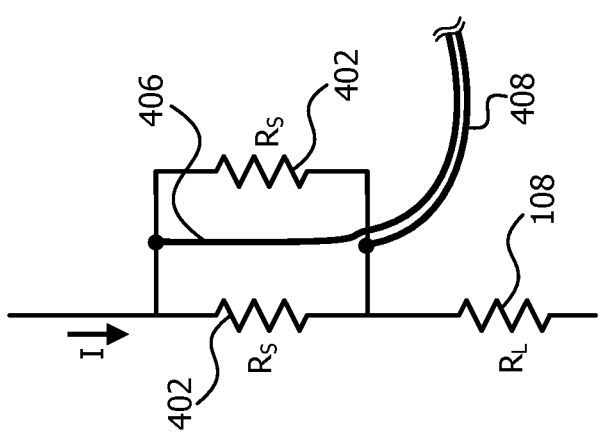
FIG. 4 is a schematic example of an input of the probe of either of FIG. 2 or 3.

As shown in FIG. 4, in some examples, two parallel current shunts 402 can be connected to the load 108 of the DUT 106. The probe 102 may include two measurement leads 406 and 408 in the input 202. The measurement lead 406 is placed symmetrically between the two parallel current shunts 402 until it reaches lead 408, and the two leads are then routed together to probe 102. The symmetrical measurement lead 406 will pick up, in first order, equal but opposing magnetic fields from the equal currents flowing through the two parallel current shunts 402, thus cancelling the inductive effect in the voltage measurement.

In some examples, the two parallel current shunts 402 can be provided within the input 202 of the probe 102 and are attached to a circuit board of the DUT 106. In other examples, the current shunts 402 may already be connected to the circuit board of the DUT 106 and one of the leads 406 and 408 of the input 202 is placed symmetrically between the parallel current shunts 402.

Figure 5:
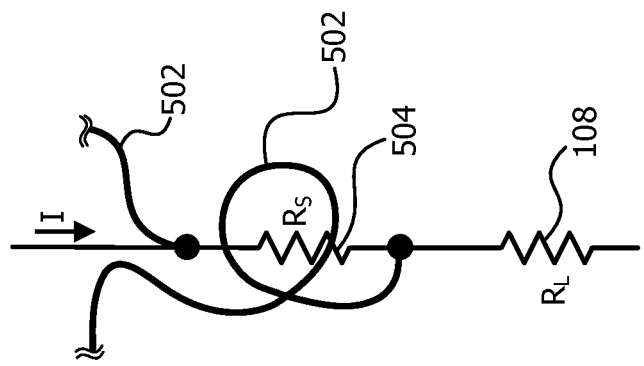
FIG. 5 is another schematic example of an input of the probe of either of FIG. 2 or 3.

FIG. 5 illustrates another example for canceling or reducing the inductance generated by a current shunt 504. In some examples, at least one of the measurement leads 502 of the input 202 of the probe 102 may include one or more twists or loops, etc. Positioning the measurement leads in a manner where they enclose some of the induced magnetic field from the current flowing through the shunt can induce additional voltage in the leads that either bucks or enforces the transient voltage generated by the shunt. Careful positioning of at least one of the leads with respect to the shunt, and careful routing and dressing of the leads may be used to cancel some or all of the inductive pick-up of the input 202 of the probe 102.

In some probes 102, the input 202 can include both the current shunt 504 and the twisted and/or looped measurement lead 502. The probe 102 can then be attached to the circuit board of the DUT 106 so that the current shunt is provided in line with the load of the DUT 106. In other examples, the twisted measurement lead 502 may be provided in the input 202 of the probe 102 and connect to the current shunt 110 already located on the circuit board of the DUT 106.

In some examples, a coaxial shunt can replace a wire or surface mount current shunt on a DUT 106. The coaxial shunt can place a return measurement lead through a center of a cylindrical resistive surface which forms the current shunt. The magnetic field from the current flow in the current shunt encircles both the current shunt and the coaxial measurement return lead, so that the inductive pickup in the current shunt is canceled by the inductive pick-up in the return measurement lead in the input 202 of the probe 102.

As discussed above, examples of the disclosure can include at least three different types of exchangeable probe tips or inputs 202. The first type of input 202 is a class of probe 102 tips that have different embedded current shunts and/or canceling inductance loops built directly into the input 202 of the probe 102.

Another type of input 202 is a class of probe tips that can sit on top of a current shunt on a customer's printed circuit board or device under test 106, with contacts and a loop built into the input 202 to create the canceling mutual inductance. In some of these examples, the input 202 may be spring-loaded on top of the current shunt 110.

A third type of input 202 may include a differential-voltage measurement tip, which is used concurrently with a current shunt on the DUT 106 and a printed circuit board of the DUT 106 includes traces to create the canceling mutual inductance under the current shunt within the DUT 106. This type of input may also be used with a coaxial shunt.

In the examples discussed above, the current shunt 110 (or any other current shunt mentioned) may be manufactured with non-magnetic materials. Current shunts that employ magnetic materials may be used, but may exhibit greater skin-loss effects than are felt by current shunts manufactured with non-magnetic materials. Skin-loss effects may limit the bandwidth of the current measurement in some examples.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 an isolated differential current shunt measurement probe, comprising an isolation barrier; a differential input side having a low-noise, low-impedance input configured to receive a voltage signal across a current shunt connected to a device under test and transmit the voltage signal across the isolation barrier; and an output side configured to receive the voltage signal across the isolation barrier and output the voltage signal to a test and measurement instrument.

Example 2 is the isolated differential current shunt measurement probe of example 1, wherein the input side includes a low-noise amplifier configured to amplify the voltage signal prior to being transmitted.

Example 3 is the isolated differential current shunt measurement probe of example 2, wherein the input side further includes a variable amplifier coupled to the low-noise amplifier.

Example 4 is the isolated differential current shunt measurement probe of any one of examples 1-3, wherein the input side includes an upconverter configured to convert the voltage signal from a baseband frequency signal to a microwave frequency signal for transmission, and wherein the output side includes a downconverter configured to convert the microwave frequency signal into the baseband frequency signal after being received on the output side.

Example 5 is the isolated differential current shunt measurement probe of any one of examples 1-4, wherein the input side includes a digitizer configured to digitize the voltage signal prior to being transmitted across the isolation barrier.

Example 6 is the isolated differential current shunt measurement probe of any one of examples 1-5, wherein the input includes the current shunt and the current shunt is a coaxial shunt.

Example 7 is the isolated differential current shunt measurement probe of any one of examples 1-6, wherein the current shunt is a coaxial shunt.

Example 8 is the isolated differential current shunt measurement probe of any one of examples 1-7, wherein the input includes two parallel current shunts and at least one measurement lead placed symmetrically between the parallel current shunts.

Example 9 is the isolated differential current shunt measurement probe of any one of examples 1-5, wherein the input includes at least one measurement lead positioned with respect to the current shunt to form a mutual inductance that at least partially cancels an error in the voltage signal due to an inductance of the current shunt.

Example 10 is the isolated differential current shunt measurement probe of example 9, wherein the input further includes the current shunt.

Example 11 is the isolated differential current shunt measurement probe of any one of examples 1-10, wherein the isolation barrier is a microwave isolation barrier or an optical isolation barrier.

Example 12 is an isolated differential current shunt measurement probe, comprising an isolation barrier; an input side including a low-noise, low-impedance input configured to receive a voltage signal across a current shunt, and a transmitter configured to transmit the voltage signal across the isolation barrier; and an output side separated from the input side by the isolation barrier, the output side including a receiver configured to receive the voltage signal from the input side across the isolation barrier, and an output to transmit the voltage signal to a test and measurement instrument.

Example 13 is the isolated differential current shunt measurement probe of example 12, wherein the input side further includes a low-noise amplifier electrically coupled directly to the input to amplify the voltage signal prior to being transmitted.

Example 14 is the isolated differential current shunt measurement probe of example 13, wherein the input side further includes a variable amplifier coupled to the low-noise amplifier and the transmitter.

Example 15 is the isolated differential current shunt measurement probe of any one of examples 12-14, wherein the input side further includes an upconverter configured to convert the voltage signal from a baseband frequency signal to a microwave frequency signal and the transmitter is a microwave structure to transmit the microwave frequency signal, and wherein the output side further includes a downconverter configured to convert the microwave frequency signal into the baseband frequency signal after being received by the receiver.

Example 16 is the isolated differential current shunt measurement probe of any one of examples 12-15, wherein the input side further includes a digitizer configured to digitize the voltage signal prior to being transmitted by the transmitter.

Example 17 is the isolated differential current shunt measurement probe of examples 12-16, wherein the input side includes the current shunt.

Example 18 is the isolated differential current shunt measurement probe of examples 12-17 wherein the current shunt is a coaxial shunt.

Example 19 is the isolated differential current shunt measurement probe of any one of examples 12-18, wherein the input side includes two parallel current shunts and at least one measurement lead placed symmetrically between the parallel current shunts.

Example 20 is the isolated differential current shunt measurement probe of any one of examples 12-19, wherein the input includes at least one measurement lead positioned with respect to the current shunt to form a mutual inductance that at least partially cancels an error in the voltage signal due to an inductance of the current shunt.

Example 21 is the isolated differential current shunt measurement probe of example 20, wherein the input further includes the current shunt.

Example 22 is the isolated differential current shunt measurement probe of any one of examples 12-21, wherein the isolation barrier is a microwave isolation barrier or an optical isolation barrier.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. An isolated differential current shunt measurement probe, comprising: an isolation barrier; a differential input side having a low-noise, low-impedance input configured to receive a voltage signal across a current shunt connected to a device under test and transmit the voltage signal across the isolation barrier; and an output side configured to receive the voltage signal across the isolation barrier and output the voltage signal to a test and measurement instrument, wherein the isolation barrier is coupled between the differential input side and the output side, and maintains isolation between the differential input side and the output side, wherein the isolation barrier is a microwave isolation barrier.

2. The isolated differential current shunt measurement probe of claim 1, wherein the input side includes a low-noise amplifier configured to amplify the voltage signal prior to being transmitted.

3. The isolated differential current shunt measurement probe of claim 2, wherein the input side further includes a variable amplifier coupled to the low-noise amplifier.

4. The isolated differential current shunt measurement probe of claim 1, wherein the input side includes an upconverter configured to convert the voltage signal from a baseband frequency signal to a microwave frequency signal for transmission, and wherein the output side includes a downconverter configured to convert the microwave frequency signal into the baseband frequency signal after being received on the output side.

5. The isolated differential current shunt measurement probe of claim 1, wherein the input side includes a digitizer configured to digitize the voltage signal prior to being transmitted across the isolation barrier.

6. The isolated differential current shunt measurement probe of claim 1, wherein the input includes the current shunt.

7. The isolated differential current shunt measurement probe of claim 6, wherein the current shunt is a coaxial shunt.

8. The isolated differential current shunt measurement probe of claim 1, wherein the input includes two parallel current shunts and at least one measurement lead placed symmetrically between the parallel current shunts.

9. The isolated differential current shunt measurement probe of claim 1, wherein the input includes at least one measurement lead positioned with respect to the current shunt to form a mutual inductance that at least partially cancels an error in the voltage signal due to an inductance of the current shunt.

10. The isolated differential current shunt measurement probe of claim 9, wherein the input further includes the current shunt.

11. An isolated differential current shunt measurement probe, comprising: an isolation barrier; an input side including: a low-noise, low-impedance input configured to receive a voltage signal across a current shunt, and a transmitter configured to transmit the voltage signal across the isolation barrier; and an output side separated from the input side by the isolation barrier, the output side including: a receiver configured to receive the voltage signal from the input side across the isolation barrier, and an output to transmit the voltage signal to a test and measurement instrument, wherein the isolation barrier is coupled between the input side and the output side, and maintains isolation between the input side and the output side, wherein the isolation barrier is a microwave isolation barrier.

12. The isolated differential current shunt measurement probe of claim 11, wherein the input side further includes a low-noise amplifier electrically coupled directly to the input to amplify the voltage signal prior to being transmitted.

13. The isolated differential current shunt measurement probe of claim 12, wherein the input side further includes a variable amplifier coupled to the low-noise amplifier and the transmitter.

14. The isolated differential current shunt measurement probe of claim 11, wherein the input side further includes an upconverter configured to convert the voltage signal from a baseband frequency signal to a microwave frequency signal and the transmitter is a microwave structure to transmit the microwave frequency signal, and wherein the output side further includes a downconverter configured to convert the microwave frequency signal into the baseband frequency signal after being received by the receiver.

15. The isolated differential current shunt measurement probe of claim 11, wherein the input side further includes a digitizer configured to digitize the voltage signal prior to being transmitted by the transmitter.

16. The isolated differential current shunt measurement probe of claim 11, wherein the input includes the current shunt.

17. The isolated differential current shunt measurement probe of claim 16, wherein the current shunt is a coaxial shunt.

18. The isolated differential current shunt measurement probe of claim 11, wherein the input includes two parallel current shunts and at least one measurement lead placed symmetrically between the parallel current shunts.

19. The isolated differential current shunt measurement probe of claim 11, wherein the input includes at least one measurement lead positioned with respect to the current shunt to form a mutual inductance that at least partially cancels an error in the voltage signal due to an inductance of the current shunt.

20. The isolated differential current shunt measurement probe of claim 19, wherein the input further includes the current shunt.

* * * * *